(12) United States Patent
Morishita

(10) Patent No.: US 11,574,699 B2
(45) Date of Patent: Feb. 7, 2023

(54) SEMICONDUCTOR DEVICE EQUIPPED WITH GLOBAL COLUMN REDUNDANCY

(71) Applicant: Micron Technology, Inc., Boise, ID (US)

(72) Inventor: Satoshi Morishita, Yokohama (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/364,809

(22) Filed: Jun. 30, 2021

(65) Prior Publication Data

US 2023/0005565 A1 Jan. 5, 2023

(51) Int. Cl.
*G11C 29/00* (2006.01)
*G11C 29/44* (2006.01)
*G11C 29/36* (2006.01)
*G11C 29/12* (2006.01)
*G11C 29/40* (2006.01)

(52) U.S. Cl.
CPC ............ *G11C 29/702* (2013.01); *G11C 29/36* (2013.01); *G11C 29/4401* (2013.01); *G11C 2029/1204* (2013.01); *G11C 2029/4002* (2013.01)

(58) Field of Classification Search
CPC ... G11C 29/702; G11C 29/36; G11C 29/4401; G11C 2029/1204; G11C 2029/4002
See application file for complete search history.

(56) References Cited

U.S. PATENT DOCUMENTS

| | | | | |
|---|---|---|---|---|
| 7,277,307 B1* | 10/2007 | Yelluru | ................. | G11C 15/04 365/207 |
| 2001/0056557 A1* | 12/2001 | Kawagoe | ............... | G11C 29/72 714/710 |
| 2007/0171739 A1* | 7/2007 | Kim | ..................... | G11C 29/38 365/201 |

* cited by examiner

*Primary Examiner* — Han Yang
(74) *Attorney, Agent, or Firm* — Dorsey & Whitney LLP

(57) ABSTRACT

Disclosed herein is an apparatus that includes a plurality of column planes each including a plurality of bit lines, an access control circuit configured to select one of the plurality of bit lines in each of the plurality of column planes based on a column address to read a plurality of data-bits, a data generating circuit configured to generate an expected-bit based at least in part on the data-bits, and an analyzing circuit configured to generate a fail-bit data indicating which one of the data-bits does not match the expected-bit when one of the data-bits does not match the expected-bit.

20 Claims, 8 Drawing Sheets

| RB0 | RB1 | RB2 | RB6 | RB7 | RB8 | RB12 | RB13 | RB14 | S1 | S2 | S3 | SEL | EXPD |
|---|---|---|---|---|---|---|---|---|---|---|---|---|---|
| 1 | 1 | 1 | 1 | 1 | 1 | 1 | 1 | 1 | 0 | 0 | 0 | 1 | 1 |
| 0 | 0 | 0 | 0 | 0 | 0 | 0 | 0 | 0 | 1 | 1 | 1 | 0 | 0 |
| 0 | 1 | 1 | 1 | 1 | 1 | 1 | 1 | 1 | 1 | 0 | 0 | 1 | 1 |
| 1 | 1 | 0 | 0 | 0 | 0 | 0 | 0 | 0 | 1 | 1 | 1 | 0 | 0 |
| 0 | 0 | 1 | 0 | 1 | 1 | 1 | 1 | 1 | 1 | 1 | 0 | 1 | 1 |
| 1 | 0 | 0 | 1 | 0 | 0 | 0 | 0 | 0 | 1 | 1 | 1 | 0 | 0 |
| 1 | 1 | 1 | 0 | 0 | 1 | 0 | 0 | 0 | 0 | 1 | 1 | 1 | 1 |
| 0 | 1 | 1 | 0 | 1 | 1 | 0 | 1 | 1 | 1 | 1 | 1 | 0 | 0 |

FIG.7

| Fall Plane info | BB0 | BB1 | BB2 | BB3 | BB4 | BB5 |
|---|---|---|---|---|---|---|
| No Errors(All Pass) | 0 | 0 | 0 | 0 | 0 | 0 |
| CP0 | 1 | 0 | 0 | 0 | 0 | 0 |
| CP1 | 0 | 1 | 0 | 0 | 0 | 0 |
| CP2 | 1 | 1 | 0 | 0 | 0 | 0 |
| CP3 | 0 | 0 | 1 | 0 | 0 | 0 |
| CP4 | 1 | 0 | 1 | 0 | 0 | 0 |
| CP5 | 0 | 1 | 1 | 0 | 0 | 0 |
| CP6 | 1 | 1 | 1 | 0 | 0 | 0 |
| CP7 | 0 | 0 | 0 | 1 | 0 | 0 |
| CP8 | 1 | 0 | 0 | 1 | 0 | 0 |
| CP9 | 0 | 1 | 0 | 1 | 0 | 0 |
| CP10 | 1 | 1 | 0 | 1 | 0 | 0 |
| CP11 | 0 | 0 | 1 | 1 | 0 | 0 |
| CP12 | 1 | 0 | 1 | 1 | 0 | 0 |
| CP13 | 0 | 1 | 1 | 1 | 0 | 0 |
| CP14 | 1 | 1 | 1 | 1 | 0 | 0 |
| CP15 | 0 | 0 | 0 | 0 | 1 | 0 |
| Multi-bit(More than one CP failed) | 0 | 0 | 0 | 0 | 1 | 1 |

FIG.8

SEMICONDUCTOR DEVICE EQUIPPED WITH GLOBAL COLUMN REDUNDANCY

BACKGROUND

As methods for replacing a defective bit line with a spare bit line, a local column redundancy method in which a spare bit line is prepared for each column plane and a global column redundancy method in which a spare column plane is prepared and a defective bit line included in each column plane is replaced with one of bit lines in the spare column plane are known. The local column redundancy method has an advantage that, even when two or more bit lines are defective among a plurality of bit lines belonging to different column planes and selected at the same time with a same column address, these bit lines can be replaced with spare bit lines. However, in the local column redundancy method, if there is one defective bit line, all the bit lines selected at the same time with a column address are replaced with spare bit lines and therefore many spare bit lines need to be prepared. In contrast thereto, the global column redundancy method enables only defective bit lines to be replaced with bit lines in the spare column plane and the recovery efficiency is accordingly high. However, in the global column redundancy method, which bit line among a plurality of bit lines selected at the same time with a same column address is to be replaced with a spare bit line needs to be identified in a test process for detecting defective bit lines, and the test process is complicated. Therefore, simplification of the test process in a semiconductor device according to the global column redundancy method is demanded.

BRIEF DESCRIPTION OF THE DRAWINGS

FIG. 7 is a truth table of the data generation circuit according to an embodiment of the present disclosure.

FIG. 8 is a truth table of an analyzing circuit according to an embodiment of the present disclosure.

DETAILED DESCRIPTION

Various embodiments of the present disclosure will be explained below in detail with reference to the accompanying drawings. The following detailed description refers to the accompanying drawings that show, by way of illustration, specific aspects, and embodiments in which the present disclosure may be practiced. These embodiments are described in sufficient detail to enable those skilled in the art to practice the present disclosure. Other embodiments may be utilized, and structural, logical, and electrical changes may be made without departing from the scope of the present disclosure. The various embodiments disclosed herein are not necessary mutually exclusive, as some disclosed embodiments can be combined with one or mom other disclosed embodiments to form new embodiments.

Figure 1:
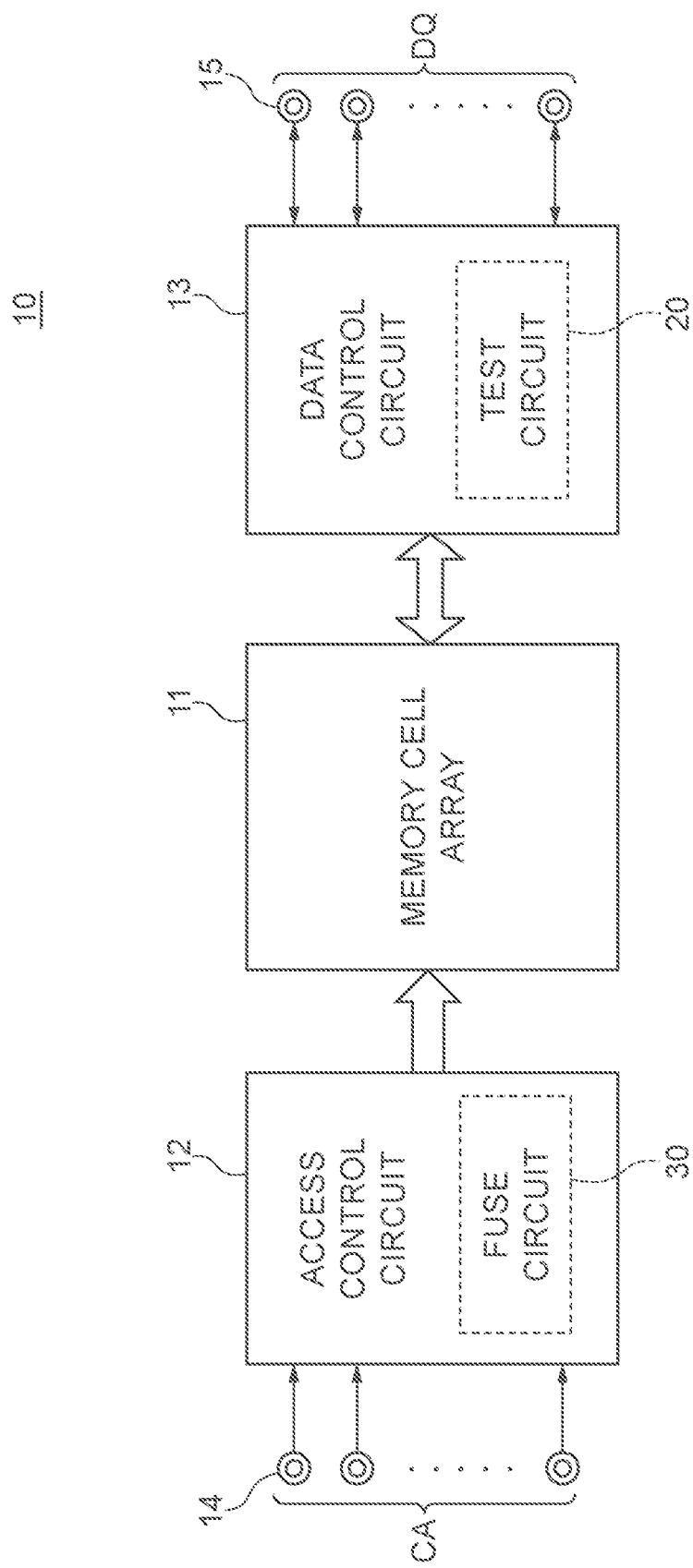
FIG. 1 is a block diagram showing a configuration of a semiconductor device according to an embodiment of the present disclosure.

FIG. 1 is a block diagram showing a configuration of a semiconductor device 10 according to an embodiment of the present disclosure. The semiconductor device 10 shown in FIG. 1 is, for example, a dynamic random access memory (DRAM) and includes a memory cell array 11, an access control circuit 12 that accesses the memory cell army 11, and a data control circuit 13 that performs input/output of a data to/from the memory cell array 11. The access control circuit 12 performs an access to the memory cell array 11 based on a command address signal CA input from an external controller via a command address terminal 14. At the time of a read operation, a data DQ read from the memory cell array 11 is output to a data terminal 15 via the data control circuit 13. At the time of a write operation, a data DQ input to the data terminal 15 from an external controller is supplied to the memory cell array 11 via the data control circuit 13. The data control circuit 13 includes a test circuit 20. The test circuit 20 is a circuit for detecting defective bit lines included in the memory cell army 11. The access control circuit 12 includes a fuse circuit 30. The fuse circuit 30 stores column addresses corresponding to defective bit lines.

Figure 2:
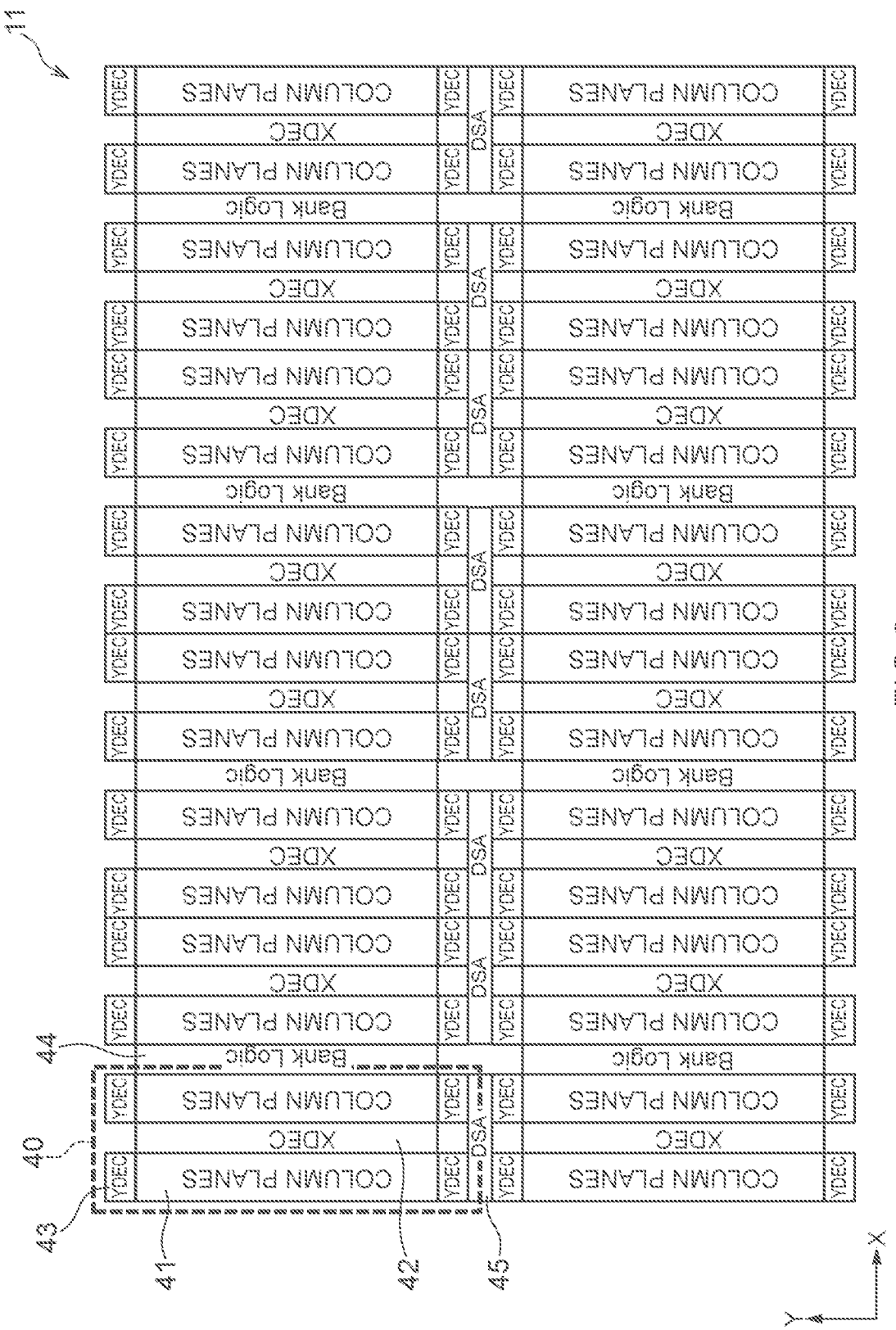
FIG. 2 is a schematic diagram showing a configuration of a memory cell array according to an embodiment of the present disclosure.

FIG. 2 is a schematic diagram showing a configuration of the memory cell array 11 according to an embodiment of the present disclosure. As shown in FIG. 2, the memory cell array 11 includes a plurality of memory banks 40. One memory bank 40 includes two column plane regions 41 arrayed in an X direction. A row decoder 42 is placed between the two column plane regions 41. Column decoders 43 are respectively placed on both sides in a Y direction of the column plane regions 41. A bank logic circuit region 44 is arranged between ones of the memory banks 40 adjacent in the X direction. An amplifier circuit region 45 including a data amplifier and the like is arranged between ones of the memory banks 40 adjacent in the Y direction.

Figure 3:
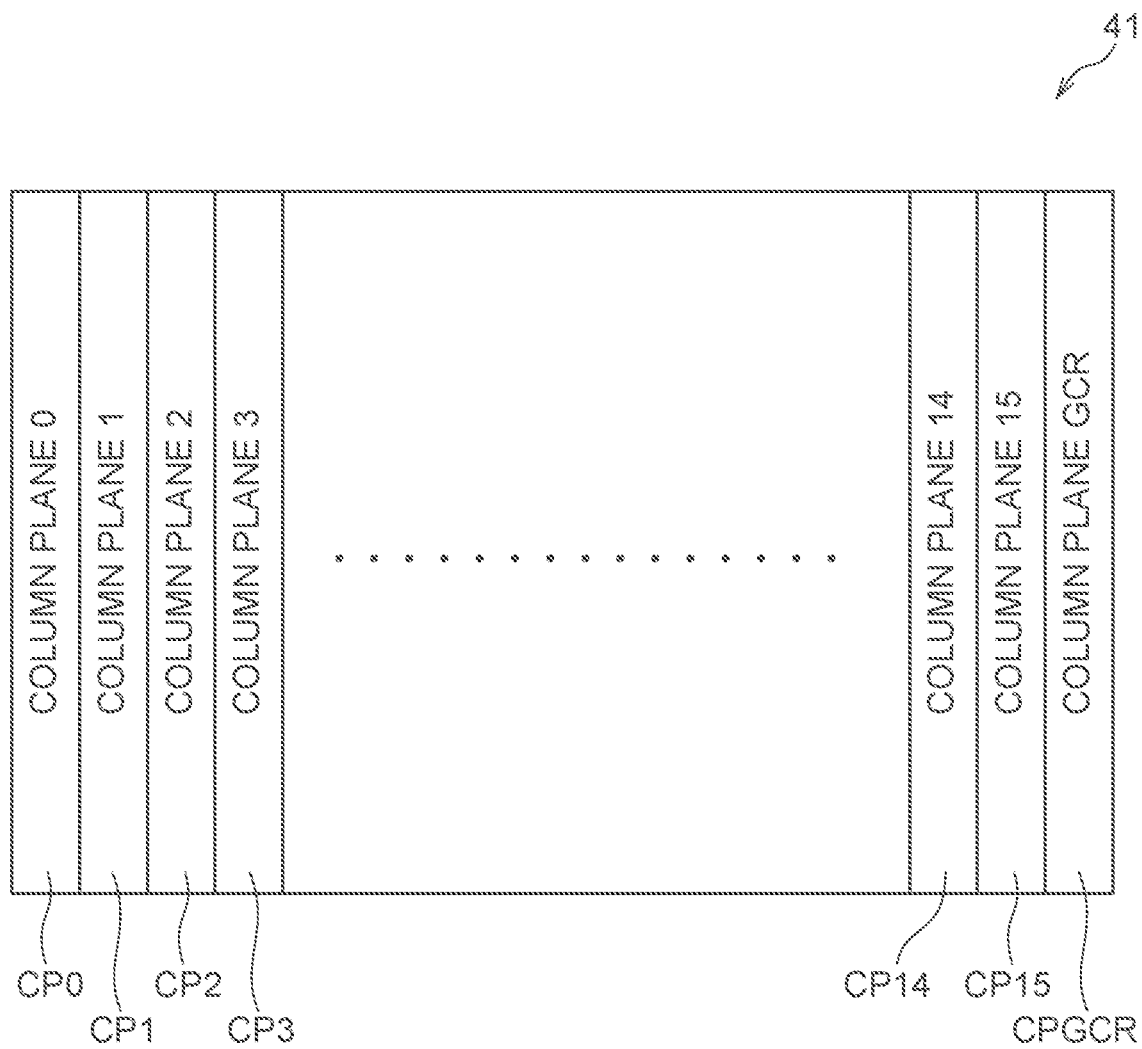
FIG. 3 is a schematic diagram showing a configuration of column plane regions according to an embodiment of the present disclosure.

FIG. 3 is a schematic diagram showing a configuration of the column plane regions 41 according to an embodiment of the present disclosure. As shown in FIG. 3, each of the column plane regions 41 includes a plurality of column planes. In an example shown in FIG. 3, each of the column plane regions 41 includes 16 column planes CP0 to CP15 and a spare column plane CPGCR. One column plane or two or more column planes for storing an error-correcting code (ECC) may be additionally included. Each of the column planes CP0 to CP15 includes a plurality of word lines and a plurality of bit lines and memory cells are placed at intersections therebetween. Selection of a word line is performed by the associated row decoder 42 and selection of a bit line is performed by the associated column decoder 43. The column planes CP0 to CP15 are simultaneously selected at one access. That is, at the time of a read operation, one bit for one DQ from each of the column planes CP0 to CP15, that is, a total of 16 bits of a read data for one DQ is simultaneously read. At the time of a write operation, one bit for one DQ is written into each of the column planes CP0 to CP15, that is, a total of 16 bits of a write data for one DQ is simultaneously written. That is, the column planes CP0 to CP15 have a same address space and, when a column address is input, one bit line corresponding to the column address is selected in each of the column planes CP0 to CP15. In this way, a set of bit lines simultaneously selected from the column planes CP0 to CP15 is determined in advance.

Figure 4:
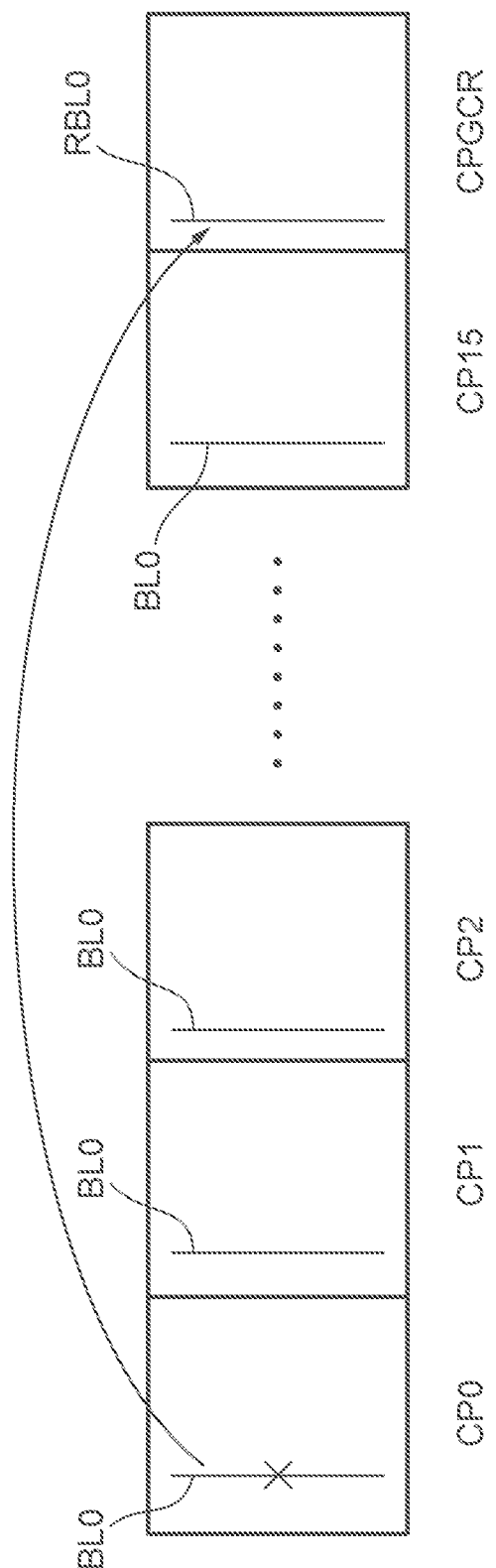
FIG. 4 is a schematic diagram for explaining a function of a spare column plane according to an embodiment of the present disclosure.

FIG. 4 is a schematic diagram for explaining a function of the spare column plane CPGCR according to an embodiment of the present disclosure. The spare column plane CPGCR includes a plurality of spare bit lines. The bit lines included in the column plane CPGCR are accessed instead of defective bit lines included in the column planes CP0 to CP15. For example, when bit lines BL0 included in the column planes CP0 to CP15 are respectively accessed with a certain column address and if the bit line BL0 included in the column plane CP0 is defective, an access to the column plane CP0 is replaced by the space column plane CPGCR and a bit line RBL0 included in the column plane CPGCR is selected. The bit lines included in the column plane CPGCR can replace the bit lines included in any of the column planes CP0 to CP15. However, when two or more bit lines among the bit lines simultaneously selected with a certain column address are defective, the recovery using the column plane CPGCR cannot be performed.

Figure 5:
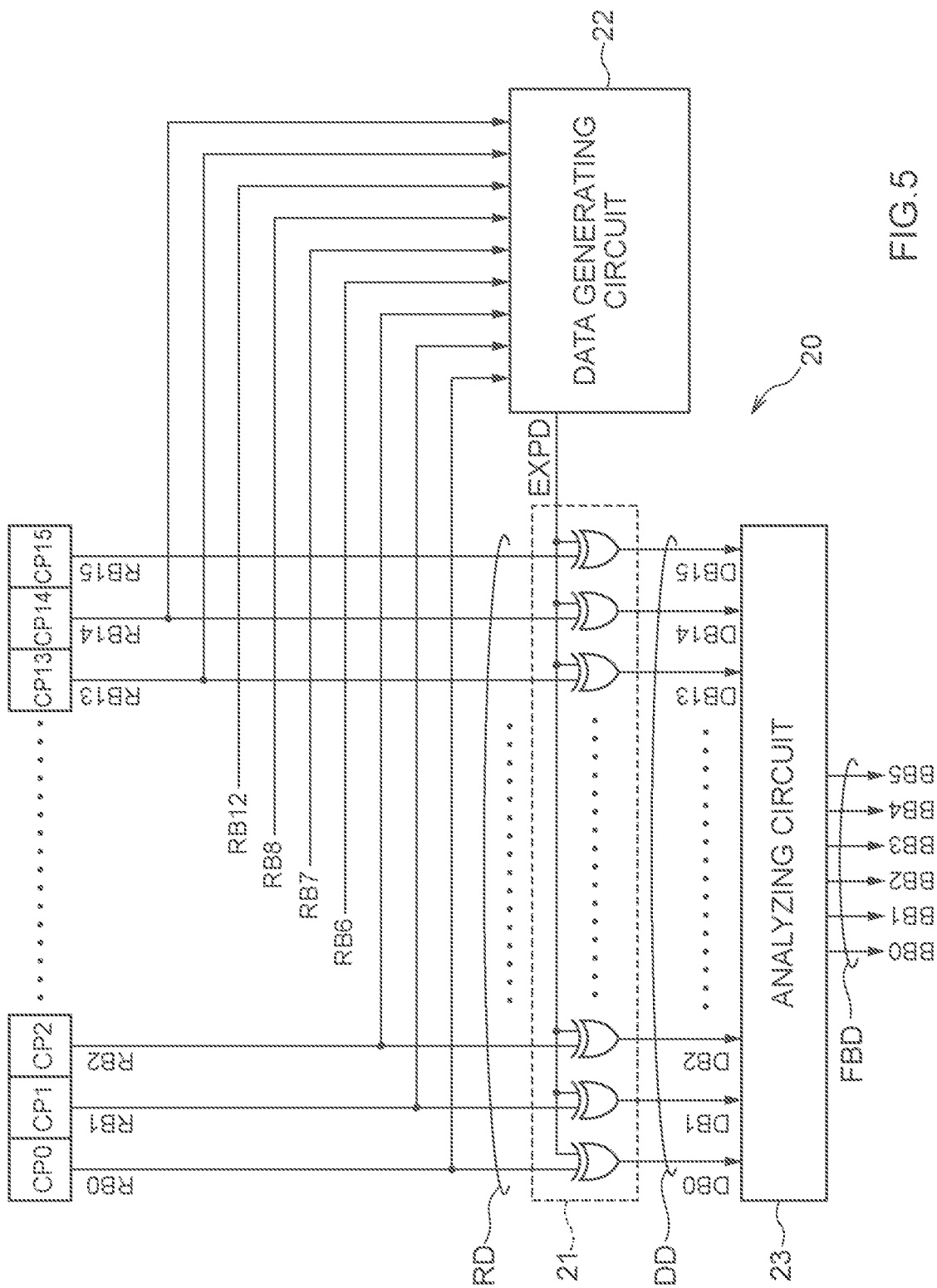
FIG. 5 is a block diagram for explaining a configuration of a test circuit according to an embodiment of the present disclosure.
Figure 6:
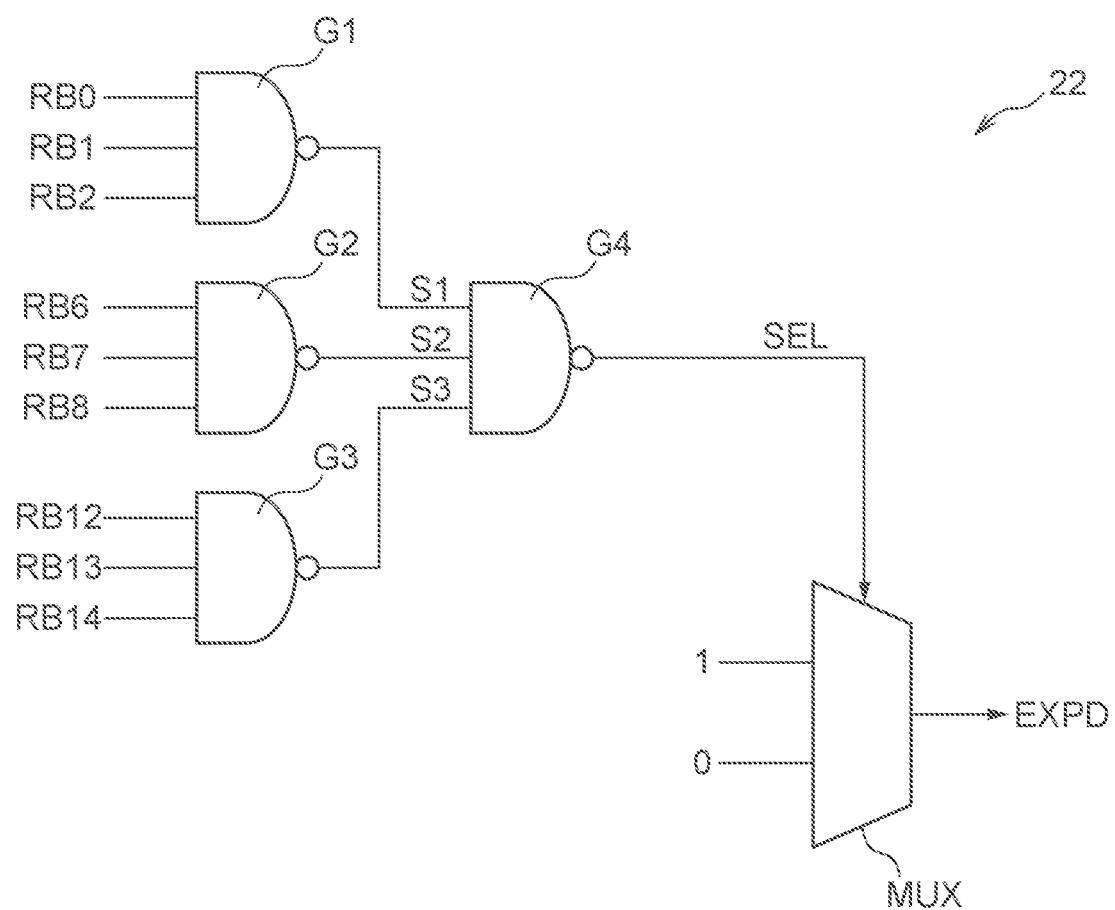
FIG. 6 is a circuit diagram of a data generating circuit according to an embodiment of the present disclosure.

FIG. 5 is a block diagram for explaining a configuration of the test circuit 20 according to an embodiment of the present disclosure. As shown in FIG. 5, the test circuit 20 includes a comparing circuit 21 that compares each of read data-bits RB0 to RB15 of a read data RD read from the column planes CP0 to CP15 with an expected value EXPD, a data generating circuit 22 that generates the expected value EXPD, and an analyzing circuit 23 that generates a fail-bit data FBD based on a decision data DD output from the comparing circuit 21. The data generating circuit 22 generates the expected value EXPD based on some of the read data-bits RB0 to RB15. In an example shown in FIG. 5, a one-bit expected value EXPD is generated based on read data-bits RB0, RB1, RB2, RB6, RB7, RB8, RB12, RB13, and RB14 respectively read from the column planes CP0, CP1, CP2, CP6, CP7, CP8, CP12, CP13, and CP14. The data generating circuit 22 includes NAND gate circuits G1 to G4 and a multiplexer MUX as shown in FIG. 6. The NAND gate circuit G1 receives the read data-bits RB0, RB1, and RB2 and generates a signal S1, the NAND gate circuit G2 receives the read data-bits RB6, RB7, and RB8 and generates a signal S2, and the NAND gate circuit G3 receives the read data-bits RB12, RB13, and RB14 and generates a signal S3. The NAND gate circuit G4 receives the signals S1 to S3 and generates a signal SEL. The multiplexer MUX decides a logic level of the expected value EXPD based on a logic level of the signal SEL. Specifically, the multiplexer MUX outputs the expected value EXPD having a logic level "1" when the logic level of the signal SEL is "1", and outputs the expected value EXPD having a logic level "0" when the logic level of the signal SEL is "0". The signal SEL may be used without any change as the expected value EXPD. NOR gate circuits may be substituted for the NAND gate circuits G1 to G4.

FIG. 7 is a truth table of the data generation circuit 22 according to an embodiment of the present disclosure. As shown in FIG. 7, the logic levels indicated by a majority of the read data-bits RB0, RB1, RB2, RB6, RB7, RB8, RB12, RB13, and RB14 match with the logic level of the expected value EXPD in most cases. That is, the expected value EXPD is decided by a majority voting of the logic levels of the read data-bits RB0, RB1, RB2, RB6, RB7, RB8, RB12, RB13, and RB14. Therefore, when the expected values of the read data-bits RB0 to RB15 all have one of logic levels and the likelihood of inclusion of data bits inverted to the other logic level is sufficiently low, the expected value EXPD generated by the data generating circuit 22 can be considered as an overall expected value of the read data-bits RB0 to RB15. As an exception, as indicated by reference sign 51, when the three read data-bits input to one of the NAND gate circuits G1 to G3, for example, the read data-bits RB0, RB1, and RB2 are all inverted to "1" even if the overall expected value of the read data-bits RB0 to RB15 is "0", the expected value EXPI) generated by the data generating circuit 22 becomes "1" and an incorrect expected value EXPD is generated. Furthermore, as indicated by reference sign 52, when data bits inverted to "0" are input to all the NAND gate circuits G1 to G3 even if the overall expected value of the read data-bits RB0 to RB15 is "1", the expected value EXPD generated by the data generating circuit 22 becomes "0" and an incorrect expected value EXPD is generated.

The expected value EXPD generated in this way is compared by the comparing circuit 21 with each of the read data-bits RB0 to RB15 of the read data RD. A decision data DD obtained as a result of comparing is input to the analyzing circuit 23. The decision data DD is composed of decision-bits DB0 to DB15 respectively corresponding to the read data-bits RB0 to RB15. Each of the decision-bits DB0 to DB15 has one pass level (for example, "0") when the corresponding read data-bits RB0 to RB15 match with the expected value EXPD, and has a fail level (for example, "1") when the corresponding read data-bits RB0 to RB15 is mismatched (e.g., do not match) with the expected value EXPD. Therefore, the decision-bits DB0 to DB15 indicate addresses of column planes that have output incorrect read data-bits and the number of the column planes.

FIG. 8 is a truth table of the analyzing circuit 23 according to an embodiment of the present disclosure. As shown in FIG. 8, the analyzing circuit 23 generates the fail-bit data FBD by encoding the decision-bits DB0 to DB15. For example, when all the decision-bits DB0 to DB15 indicate a pass, values of fail-bits BB0 to BB5 constituting the fail-bit data FBD are "000000", which indicates that 16 bit lines selected at the same time are not defective. When only the decision-bit DB0 indicates a fail, the values of the fail-bits BB0 to BB5 constituting the fail-bit data FBD are "000001", which indicates that a bit line included in the column plane CP0 is defective. Similarly, when only the decision-bit DB1 indicates a fail, the values of the fail-bits BB0 to BB5 constituting the fail-bit data FBD are "000010", which indicates that a bit line included in the column plane CP1 is defective. In contrast thereto, when two or more of the decision-bits DB0 to D315 indicate a fail, the values of the fail-bits BB0 to BB5 constituting the fail-bit data FBD are "110000", which indicates that there are two or more column planes including a defective bit line. In this case, the addresses of the column planes including a defective bit line are not identified.

Detection of defective bit lines is performed in the following procedure. First, a write command is issued from outside to the access control circuit 12, and write data having a same logic level are respectively written into the column planes CP0 to CP15 via bit lines simultaneously selected. Next, a read operation is performed to the same address and a read data RD is read via the bit lines. A part of the read data RD is input to the data generating circuit 22 and the expected value EXPD is generated based thereon. The expected value EXPD is compared by the comparing circuit 21 with each of the read data-bits RB0 to RB15 of the read data RD, and the decision data DD is generated according to comparing results. The decision data DD is converted to the fail-bit data FBD by the analyzing circuit 23. The fail-bit data FBD is output to an external tester via an output circuit included in the data control circuit 13. The tester analyzes the fail-bit data FBD and writes column addresses corresponding to defective bit lines into the fuse circuit 30. Accordingly, when a column address corresponding to a defective bit line is input at the time of a normal read/write operation, the access is performed to a spare bit line included in the column plane CPGCR, instead of the defective bit line.

When the value of the fail-bit data FBD is "110000", that is, there are two or more column planes including a defective bit line, a recovery using the column plane CPGCR cannot be performed and therefore the device is recovered by a different method or is discarded as a defective product. When the expected value EXPD generated by the data generating circuit 22 itself includes an error as indicated by reference signs 51 and 52 in FIG. 7, two or more of the decision-bits DB0 to DB15 certainly indicate a fail and the values of the fail-bit data FBD are "110000" as in the case described above. That is, even when the expected value EXPD itself includes an error, the impossibility of a recovery using the column plane CPGCR is accurately shown. In this way, the semiconductor device 10 according to the present embodiment can specify a column plane including a defective bit line without having a circuit that holds expected values. Accordingly, the test process can be more simplified while the circuit scale is reduced.

Although this disclosure has been disclosed in the context of certain preferred embodiments and examples, it will be understood by those skilled in the art that the disclosures extend beyond the specifically disclosed embodiments to other alternative embodiments and/or uses of the disclosures and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosures. It should be understood that various features and aspects of the disclosed embodiments can be combined with or substituted for one another in order to form varying mode of the disclosed disclosure. Thus, it is intended that the scope of at least some of the present disclosure herein disclosed should not be limited by the particular disclosed embodiments described above.

The invention claimed is:

1. An apparatus comprising:
a plurality of column planes each including a plurality of bit lines;
an access control circuit configured to select one of the plurality of bit lines in each of the plurality of column planes based on a column address to read a plurality of data-bits;
a data generating circuit configured to generate an expected-bit based at least in part on the plurality of data-bits read from the plurality of column planes; and
an analyzing circuit configured to generate a fail-bit data indicating which one of the plurality of data-bits does not match the expected-bit when one of the plurality of data-bits does not match the expected-bit.

2. The apparatus of claim 1, further comprising an output circuit configured to output the fail-bit data to outside.

3. The apparatus of claim 2, wherein the analyzing circuit is configured to bring the fail-bit data into a first value when all of the plurality of data-bits match with the expected-bit.

4. The apparatus of claim 3, wherein the analyzing circuit is configured to bring the fail-bit data into a second value when two or more of the plurality of data-bits do not match the expected-bit.

5. The apparatus of claim 4, wherein the second value does not include information that which of the plurality of data-bits does not match the expected-bit.

6. The apparatus of claim 1, wherein the access control circuit includes a fuse circuit configured to store a column address of a bit line corresponding to the fail-bit data.

7. The apparatus of claim 6, further comprising a spare column plane each including a plurality of spare bit lines, wherein the access control circuit is configured to access one of the spare bit lines instead of the bit line corresponding to the fail-bit data.

8. An apparatus comprising:
a plurality of column planes each including a plurality of bit lines:
an access control circuit configured to select one of the plurality of bit lines in each of the plurality of column planes based on a column address to read a plurality of data-bits:
a data generating circuit configured to generate the expected-bit by a majority voting of a part of the plurality of data-bits
an analyzing circuit configured to generate a fail-bit data indicating which one of the plurality of data-bits does not match the expected-bit when one of the plurality of data-bits does not match the expected-bit; and
an output circuit configured to output the fail-bit data to outside,
wherein the analyzing circuit is configured to bring the fail-bit data into a first value when all of the plurality of data-bits match with the expected-bit,
wherein the analyzing circuit is configured to bring the fail-bit data into a second value when two or more of the plurality of data-bits do not match the expected-bit, and
wherein the second value does not include information that which of the plurality of data-bits does not match the expected-bit.

9. The apparatus of claim 8, wherein the data generating circuit includes:
a first logic circuit configured to generate a first bit based on predetermined three or more of the plurality of data-bits;
a second logic circuit configured to generate a second bit based on another predetermined three or more of the plurality of data-bits;
a third logic circuit configured to generate a third bit based on still another predetermined three or more of the plurality of data-bits; and
a fourth logic circuit configured to decide a logic level of the expected-bit based on the first, second, and third bits.

10. The apparatus of claim 9, wherein each of the first, second, third, and fourth logic circuit includes a NAND logic circuit or a NOR logic circuit.

11. An apparatus comprising:
a plurality of first signal lines each configured to convey an associated one of first data-bits;
a plurality of second signal lines each configured to convey an associated one of second data-bits;
a data generating circuit configured to generate an expected-data based on the first data-bits regardless of the second data-bits;

a comparing circuit configured to compare the expected-data with the first data-bits to generate first decision-bits each indicating a comparing result of an associated one of the first data-bits and compare the expected-data with the second data-bits to generate second decision-bits each indicative of a comparing result of an associated one of the second data-bits; and an analyzing circuit configured to generate a fail-bit data based on the first and second decision-bits, wherein the analyzing circuit is configured to bring the fail-bit data into a first value when none bit among the first and second decision-bits indicates a mismatch, bring the fail-bit data into one of second values when one bit among the first and second decision-bits indicates a mismatch, and bring the fail-bit data into a third value when two or more bits among the first and second decision-bits indicates a mismatch.

12. The apparatus of claim 11, wherein the second values include information regarding which bit among the first and second decision-bits does not match the expected-bit.

13. The apparatus of claim 12, wherein the third value does not include information regarding which bit among the first and second decision-bits does not match the expected-bit.

14. The apparatus of claim 13, wherein the data generating circuit is configured to generate the expected-bit by a majority voting of the first data-bits.

15. The apparatus of claim 14, wherein the data generating circuit including:
a first logic circuit configured to generate a first bit based on predetermined three or more of the first data-bits;
a second logic circuit configured to generate a second bit based on another predetermined three or more of the first data-bits;
a third logic circuit configured to generate a third bit based on still another predetermined three or more of the first data-bits; and
a fourth logic circuit configured to decide a logic level of the expected-bit based on the first, second, and third bits.

16. The apparatus of claim 15, wherein each of the first, second, third, and fourth logic circuit includes a NAND logic circuit or a NOR logic circuit.

17. A method comprising:
writing a test data comprising a plurality of bits each having a first logic level into a plurality of memory cells through an associated one of bit lines;
reading the test data from the plurality of memory cells through the bit lines;
generating an expected logic level based on a part of the test data read through the bit lines;
generating a fail-bit data by comparing the expected logic level with a logic level of each bit of the test data read through the bit lines; and
replacing, when the fail-bit data indicates that one of the bit lines is defective, the one of the bit lines with a spare bit line.

18. The method as claimed in claim 17, further comprising bringing the fail-bit data into a first value when all of the bits of the test data read through the bit lines have the first logic level.

19. The method as claimed in claim 18, further comprising bring the fail-bit data into a second value when two or more of the bits of the test data read through the bit lines have a second logic level.

20. The method as claimed in claim 19, wherein the second value does not include information regarding which bit among the test data read through the bit lines has the second logic level.

* * * * *